United States Patent
Yoo et al.

(10) Patent No.: US 10,823,693 B2
(45) Date of Patent: Nov. 3, 2020

(54) SYSTEM, APPARATUS AND METHOD FOR ACCURATE MEASUREMENT OF OFF-CHIP TEMPERATURE

(71) Applicant: Silicon Laboratories Inc., Austin, TX (US)

(72) Inventors: Euisoo Yoo, Austin, TX (US); Thomas Edward Voor, Cedar Park, TX (US); John M. Khoury, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 345 days.

(21) Appl. No.: 15/861,953

(22) Filed: Jan. 4, 2018

(65) Prior Publication Data
US 2019/0204253 A1    Jul. 4, 2019

(51) Int. Cl.
| | |
|---|---|
| *G01N 27/18* | (2006.01) |
| *H01Q 1/00* | (2006.01) |
| *H03L 1/02* | (2006.01) |
| *G01K 13/00* | (2006.01) |
| *G01K 7/24* | (2006.01) |

(52) U.S. Cl.
CPC .............. *G01N 27/18* (2013.01); *G01K 7/24* (2013.01); *G01K 13/00* (2013.01); *H01Q 1/002* (2013.01); *H03L 1/022* (2013.01); *G01K 2219/00* (2013.01)

(58) Field of Classification Search
CPC ........... G01N 27/18; G01K 7/24; G01K 13/00
See application file for complete search history.

(56) References Cited

U.S. PATENT DOCUMENTS

| | | | |
|---|---|---|---|
| 2010/0301910 A1* | 12/2010 | Hu | H03L 1/022 327/156 |
| 2012/0001611 A1* | 1/2012 | Sato | H02M 1/32 323/299 |

OTHER PUBLICATIONS

U.S. Appl. No. 15/626,425, filed Jun. 19, 2017, entitled "Voltage Regulator Having Feedback Path" by Li Wei, et al.

* cited by examiner

*Primary Examiner* — Marc Anthony Armand
(74) *Attorney, Agent, or Firm* — Trop, Pruner & Hu, P.C.

(57) ABSTRACT

In an embodiment, an integrated circuit includes: a switched capacitor coupled between a supply voltage node and a divider node, where a thermistor external to the integrated circuit is to couple to the divider node; an analog-to-digital converter (ADC) coupled to the divider node to receive a voltage at the divider node and generate a digital value based thereon; and a controller coupled to the ADC to determine a temperature associated with the thermistor based at least in part on the digital value.

20 Claims, 7 Drawing Sheets

SYSTEM, APPARATUS AND METHOD FOR ACCURATE MEASUREMENT OF OFF-CHIP TEMPERATURE

BACKGROUND

Many electronic components suffer from variation in performance over temperature. In many systems including wireless communication systems, typically a crystal oscillator is used to generate a reference clock signal to be provided to circuitry of the wireless receiver and transmitter circuitry. However, regular crystal oscillators have oscillation frequency drift with temperature. This limits a given solution's operating temperature range when an inexpensive standard crystal oscillator is used. In the industry, a popular workaround for enabling a wider operating temperature range is to use an expensive temperature-compensated crystal oscillator (TCXO) to overcome temperature effects.

Another technique for compensating for temperature variation is to measure temperature by way of multiple resistors that are controllably switched to the device undergoing measurement. However, these techniques are complex and require many calibrations to occur, unnecessarily increasing expense, complexity and time for measurement.

SUMMARY OF THE INVENTION

In one aspect, an integrated circuit includes: a switched capacitor coupled between a supply voltage node and a divider node, where a thermistor external to the integrated circuit is to couple to the divider node; an analog-to-digital converter (ADC) coupled to the divider node to receive a voltage at the divider node and generate a digital value based thereon; and a controller coupled to the ADC to determine a temperature associated with the thermistor based at least in part on the digital value.

In an embodiment, the controller is to calculate a resistance of the thermistor based at least in part on the digital value and a value of a supply voltage provided to the supply voltage node. The controller may calculate the resistance of the thermistor further based on an equivalent resistance of the switched capacitor. This equivalent resistance may be based on a capacitance of the switched capacitor and a frequency of switching of the switched capacitor.

In an embodiment, the integrated circuit may further include a frequency synthesizer to generate a first clock signal. This frequency synthesizer may receive an input clock signal from an oscillator coupled to the integrated circuit and generate the first clock signal using the input clock signal. The controller may compensate for a temperature variation of the oscillator based on the temperature associated with the thermistor, the thermistor thermally coupled to the oscillator. The integrated circuit may further include a frequency divider to generate the switching frequency based on a first clock signal received from an oscillator. The integrated circuit also may include a temperature sensor to measure a temperature of the integrated circuit. In turn, the controller may control the frequency divider to generate the switching frequency based at least in part on the temperature of the integrated circuit. The controller may cause the equivalent resistance of the switched capacitor to be updated if the voltage at the divider node is outside of a predetermined range. The controller may cause the equivalent resistance of the switched capacitor to at least substantially track the resistance of the thermistor. The controller, based at least in part on the temperature, may control a capacitance of an oscillator to compensate for a temperature variation of the oscillator. The integrated circuit may further include a selection circuit to selectively couple a plurality of thermistors external to the integrated circuit to the divider node.

In another aspect, a method includes: controlling, by a controller of a semiconductor die, a first switch and a second switch to operate at a first switching frequency to cause a switched capacitor adapted on the semiconductor die to be switchably coupled between a first node and a second node; coupling a thermistor to the second node, the thermistor external to the semiconductor die; measuring a voltage at the second node when the thermistor is coupled to the second node; calculating, by the controller, a resistance of the thermistor based on a voltage of the first node, the voltage at the second node, and a resistance of the switched capacitor; and determining, by the controller, a temperature of the thermistor using the resistance of the thermistor.

In an embodiment, the method further comprises determining a temperature of the semiconductor die and based at least in part thereon, changing the first switching frequency to a second switching frequency. The method may further comprise compensating for a frequency shift of an oscillator coupled to the semiconductor die based on the temperature of the thermistor, the oscillator thermally coupled with the thermistor.

In another aspect, a system comprises: an antenna to receive and provide a radio frequency (RF) signal to an integrated circuit including a wireless transceiver; a crystal oscillator to provide a reference clock signal to the integrated circuit; a thermistor thermally coupled with the crystal oscillator; and the integrated circuit. In an embodiment, the integrated circuit may include: a frequency synthesizer to receive the reference clock signal and generate one or more clock signals using the reference clock signal; a switched capacitor coupled between a supply voltage node and a divider node, the thermistor to couple to the divider node; and a controller coupled to the divider node, where the controller is to determine a temperature associated with the thermistor based at least in part on a voltage at the divider node and compensate for frequency drift of the reference clock signal based at least in part on the temperature associated with the thermistor.

In an embodiment, the controller is to calculate a resistance of the thermistor based on the voltage at the divider node, a value of a supply voltage provided to the supply voltage node, and an equivalent resistance of the switched capacitor, the equivalent resistance of the switched capacitor based on a capacitance of the switched capacitor and a frequency of switching of the switched capacitor, where the controller is to control the frequency of switching based at least in part on a temperature of the integrated circuit. The controller may dynamically control a load capacitance of the crystal oscillator to compensate for the frequency drift.

DETAILED DESCRIPTION

In various embodiments, an integrated circuit may include a switched capacitor as part of a measurement circuit to measure temperature or other environmental condition at one or more locations external to the integrated circuit. More specifically, embodiments may be used to measure temperature of another component co-located with the integrated circuit, such as a crystal oscillator, e.g., adapted on a common circuit board. However in other embodiments, an integrated circuit having a measurement circuit as described herein may be used to measure temperature or other operating condition of other remotely located components, such as disparate components of an air conditioning system, industrial control system or so forth.

More specifically, the switched capacitor may be coupled to a thermistor located externally to the integrated circuit. Based at least in part on a voltage at a node coupling the thermistor to the switched capacitor, a resistance value of the thermistor may be determined. In turn, this resistance value may be used to determine temperature at a location of the thermistor. Embodiments may associate (e.g., thermally couple) the thermistor with a crystal oscillator. Based at least in part on a determined temperature, temperature compensation may be applied to a frequency synthesizer of the integrated circuit that uses a clock signal generated by the crystal oscillator. In turn the frequency synthesizer may receive a clock signal from the crystal oscillator and generate using the clock signal one or more clock signals for internal use within the integrated circuit. Of course in other implementations such as for a sensing application, the determined temperature may simply be reported to a consuming entity such as a control circuit of a HVAC or industrial control system.

Embodiments may be particularly suited for determining temperature of off-chip crystal oscillators. In many systems, such oscillators, particularly inexpensive oscillators, may have a steep temperature coefficient in which over a thermal operating range of approximately −40° Celsius (C) to 125° C., variation of +/−50 parts per million (PPM) is possible. Such variation may violate frequency tolerances for at least certain wireless communication protocols. As such, embodiments may provide relatively high accuracy thermal measurements (e.g., within +/−1° C.) to identify the crystal oscillator's temperature and compensate for variation based thereon.

Figure 1A:
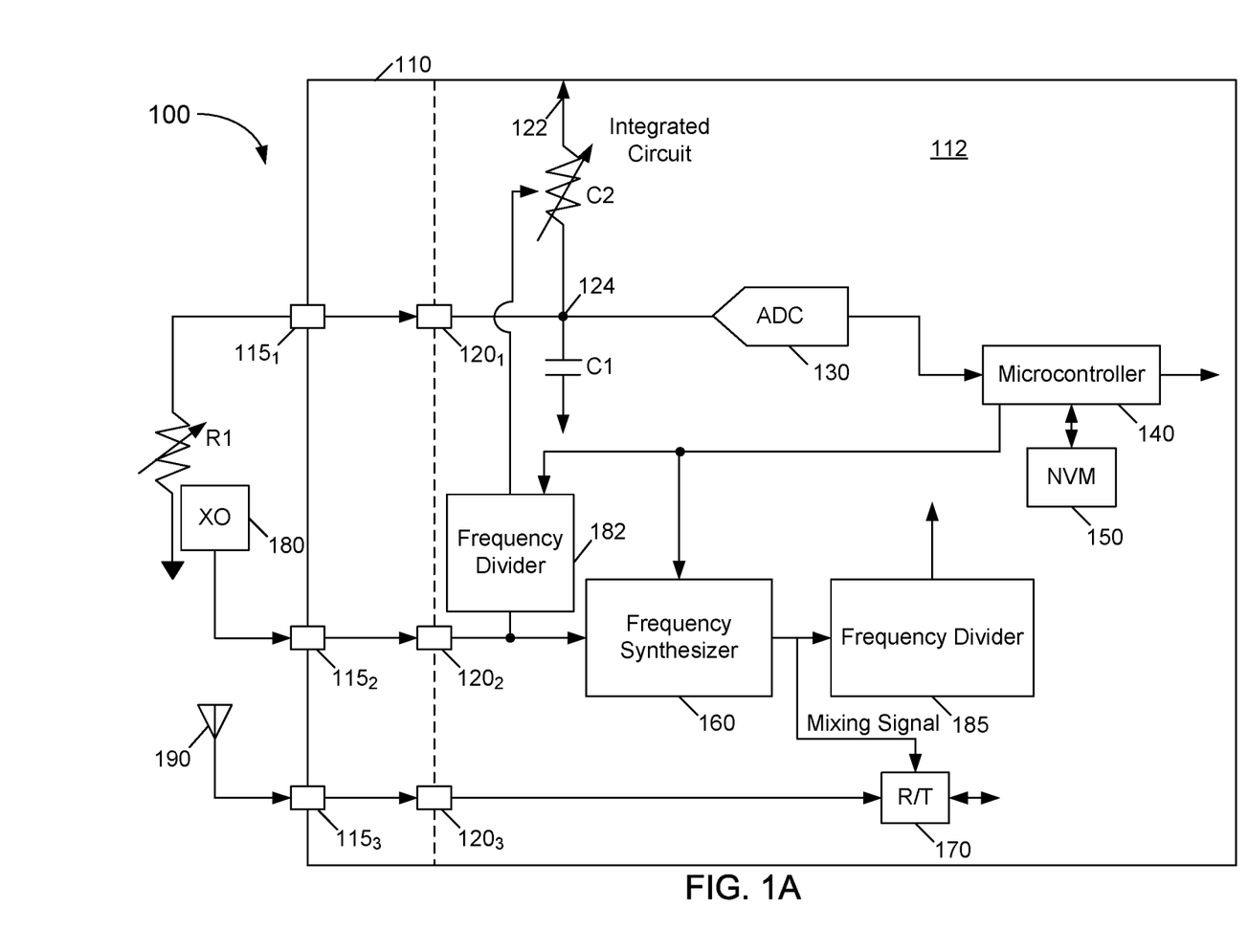
FIG. 1A is a block diagram of a system in accordance with an embodiment.

Referring now to FIG. 1A, shown is a block diagram of a system in accordance with an embodiment. As shown in FIG. 1A, system 100 may be at least a portion of any type of computing system, ranging from an Internet of Things (IoT) device, industrial control system or so forth. As illustrated, system 100 includes an integrated circuit 110. Integrated circuit 110 includes a semiconductor die 112. While only a single semiconductor die is shown, understand that a given integrated circuit 110 may include more than one such die. In various embodiments herein, integrated circuit 110 may include wireless circuitry to act as a wireless transceiver, such as a WiFi™ transceiver, Bluetooth™ transceiver, Zigbee™ transceiver or so forth.

For purposes of performing temperature measurements as described herein, an external thermistor R1, thermally coupled to a crystal oscillator 180, another off-chip component, couples via a pin $115_1$ and a pad $120_1$ to a divider node 124 to which a switched capacitor C2 couples. As an example, crystal oscillator 180 may be implemented fully off-chip. In other cases, a crystal oscillator may be formed with an off-chip crystal that in turn couples to on-chip components, including a load capacitance and amplifier that collectively with the crystal form the crystal oscillator. For purposes of discussion, assume FIG. 1A relates to an implementation with an off-chip crystal oscillator. Understand that while schematically shown as a programmable resistor, in one embodiment switched capacitor C2 is implemented as a metal-oxide-metal (MOM) switched capacitor, details of which are further described below. Of course other capacitor types are possible. As illustrated, switched capacitor C2 couples between divider node 124 and a supply voltage node 122. As such, the series combination of off-chip thermistor R1 and on-chip switched capacitor C2 acts as a voltage divider. Essentially, this voltage divider is implemented with switched capacitor C2 functioning as a pull-up resistor and thermistor R1 functioning as pull-down resistor. Based on the ratio of these two resistances, a sensed voltage is provided at divider node 124. Note that a capacitor C1 also may couple to divider node 124. Capacitor C1 may be part of an RC filter to reduce switching ripple prior to an input to an analog-to-digital converter (ADC) 130. Understand while shown at this high level in the embodiment of FIG. 1A, many variations and alternatives are possible.

The voltage present at divider node 124 is coupled to ADC 130, which digitizes the value. In an embodiment, ADC 130 may be implemented as a 12-bit ADC. Of course in other embodiments different resolutions may be present. As an example, ADC 130 may be implemented as a sigma-delta converter; however other ADC architectures are possible. Note that in embodiments, ADC 130 may be a so-called auxiliary ADC that is adapted within integrated circuit 110 to digitize a variety of incoming analog signals. To this end, a selection circuit such as a multiplexer, not shown for ease of illustration in FIG. 1A, may be coupled between divider node 124 and the input of ADC 130. When appropriately controlled to perform temperature sensing as described herein, this selection circuit may route the voltage at divider node 124 to ADC 130. In other phases of operation, other analog voltages, such as originating from various sources on-chip or off-chip (such as from one or more sensors) instead may be provided to ADC 130. Note that with a 12-bit ADC, sufficient granularity is present to detect accurate temperature changes. More specifically, with the accurate measurement circuit described herein, temperature changes of a single degree Celsius may be represented by a relatively small change in voltage (e.g., on the order of 10 or more millivolts (mV)), with such changes accurately measured by ADC 130.

As seen, the digitized value that represents the voltage at node 124 is provided from ADC 130 to a microcontroller 140. In embodiments, microcontroller 140 may be a hardware processing circuit configured to execute instructions, including instructions for performing the temperature measurement and compensation functions described herein. In an embodiment, microcontroller 140, based upon this digitized value, a measure of the supply voltage itself (which also may be sampled by ADC 130), and the equivalent resistance of switched capacitor C2, may determine the resistance of thermistor R1.

Note that the ambient temperature at thermistor R1 and an internal temperature (or temperatures) within integrated circuit 110 may be unassociated. For example, thermistor R1 may be associated with crystal oscillator 180, which may operate at a relatively stable temperature value, such that the temperature of thermistor R1 is dependent on an ambient temperature at its location, rather than operating activity of crystal oscillator 180. In contrast, integrated circuit 110 may include various high power consuming devices, such as one or more power amplifiers that, when active during transmit operations, may cause local die temperatures to rapidly rise (and fall when powered off) without any thermal effect on thermistor R1 (and vice versa).

As such, embodiments enable accurate measurement of temperature at locations external to integrated circuit 110 in a manner independent of actual temperature changes within integrated circuit 110. That is, switched capacitor C2 may be substantially temperature stable across all operating conditions. Furthermore, the equivalent resistance of this switched capacitor may be dynamically controlled to be maintained at least approximately coincident with the resistance of off-chip thermistor R1 to enable accurate temperature measurements to be made. This is the case, as in typical implementations the resistance of thermistor R1 may vary significantly with temperature. As one such example, over a thermal range of approximately −40° C. to 125° C., the resistance of thermistor R1 may vary from approximately 4 mega ohms (MOhm) to approximately 2.6 kilo ohms (kOhm). Without using a switched capacitor as herein that provides controllable resistance, measurement accuracy would suffer. That is, if a fixed resistor were to be used instead of switched capacitor C2, the wide variation between the value of these two resistors over temperature would degrade measurement accuracy.

Embodiments thus provide more accurate measurement of the thermistor's resistance over a wide temperature range without multiple calibrations or calibrations over temperature of the measurement circuit itself (or degradation of measurement accuracy across temperature). Note that with this temperature-stable switched capacitor, temperature sensing may occur with no runtime calibrations. That is, switched capacitor C2 may be calibrated at a single temperature point one time only, e.g., during manufacturing testing. The resulting equivalent resistance of switched capacitor C2 at its testing temperature (e.g., an ambient temperature) may then be stored within integrated circuit 110 for use as described herein. Note however as described further herein to enable accurate temperature measurements to be made, the equivalent resistance of switched capacitor C2 may be dynamically changed during operation as the temperature of integrated circuit 110 itself (and also temperature of thermistor R1) varies.

With further reference to FIG. 1A, note that microcontroller 140 may calculate the resistance of thermistor R1 based on the above-described voltage at divider node 124, the supply voltage, and the equivalent resistance of switched capacitor C2. In turn, this determined resistance may be used to determine a temperature of thermistor R1 (and thus its thermally coupled crystal oscillator 180). In an embodiment, microcontroller 140 may access a non-volatile memory 150 that maintains a table associating resistance values (of the external thermistor) with corresponding temperatures. As such, using the thermistor resistance as an index, a corresponding entry within this table in non-volatile memory 150 may be accessed to identify a given temperature. And in turn, in the implementation herein, a frequency synthesizer 160 of a radio portion of integrated circuit 110 may be controlled to provide temperature compensation for variations (frequency drift) in an input clock signal received from crystal oscillator 180 due to its temperature by way of control signals sent from microcontroller 140 to frequency synthesizer 160.

Thus using embodiments, a relatively low cost external crystal oscillator 180 may be used within system 100, avoiding the need for expense associated with a temperature compensated crystal oscillator (TCXO). Note that in different implementations, thermistor R1 may be implemented within a package with crystal oscillator 180, or in other cases thermistor R1 may be a separate component. In either case, thermistor R1 is thermally coupled with crystal oscillator 180.

As described above, in the embodiment of FIG. 1A integrated circuit 110 includes radio circuitry. As illustrated, incoming radio frequency (RF) signals may be received via an antenna 190 and coupled via pin $115_3$ and pad $120_3$ to receiver/transmitter circuitry 170. In embodiments, such circuitry may include various amplification and other gain control circuitry, downconversion circuitry, baseband processing circuitry and so forth. In addition, similar circuitry for upconverting baseband signals to RF levels also may be present to enable transmission of RF signals.

As further illustrated in FIG. 1A, frequency synthesizer 160, which may be implemented in an embodiment as a phase lock loop (PLL), receives an input clock signal from crystal oscillator 180, via pin $115_2$ and pad $120_2$. In turn, frequency synthesizer 160 may be controlled to generate one or more clock signals for use within integrated circuit 110. Of interest here, frequency synthesizer 160 may generate at least one clock signal that acts as a mixing signal, e.g., a local oscillator (LO) frequency signal, to downconvert (and upconvert) signals within receiver/transmitter circuitry 170. Furthermore, this signal may be provided to a frequency divider 185. Frequency divider 185 may be programmably and dynamically controlled to adjust its frequency division ratio to output other clock signals. As further illustrated in FIG. 1A, the input clock signal from crystal oscillator 180 further is provided to another frequency divider 182, which may be programmably and dynamically controlled to adjust its frequency division ratio, to output a switching signal provided to switched capacitor C2 to control its equivalent resistance as described herein. In other cases, more frequency dividers may be present, and in such cases, the LO signal may be output from one of these additional frequency dividers.

Figure 1B:
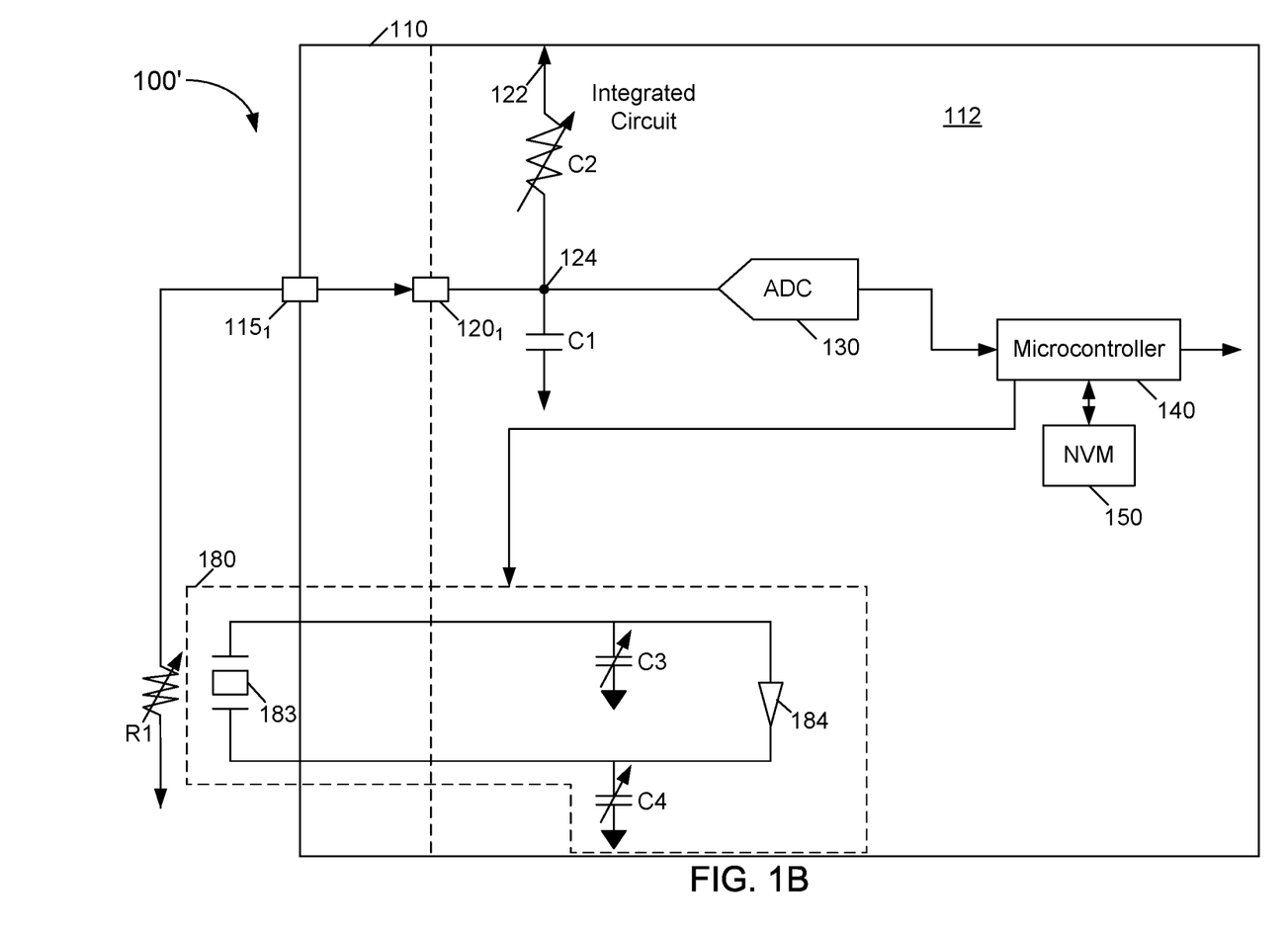
FIG. 1B is a block diagram of a system in accordance with another embodiment

In other cases, a crystal oscillator can be implemented using an off-chip crystal and on-chip components. Referring now to FIG. 1B, shown is a block diagram of a system in accordance with another embodiment of the present invention. As shown in FIG. 1B, system 100' may be generally implemented the same as system 100 of FIG. 1A. Certain details are omitted however for ease of illustration of further explanation of another oscillator arrangement. More specifically as shown in FIG. 1B, a crystal oscillator 180 is implemented with an off-chip crystal 183 that couples to load capacitors C3 and C4 that in turn further couple to input and output of an amplifier 184. Collectively these components form a crystal oscillator.

Note that off-chip crystal 183 may be separately or commonly packaged with thermistor R1. In either case, as with the above embodiment, the resistance of thermistor R1 may be measured and used to identify a temperature of crystal 183. In turn, microcontroller 140 may generate control signals to dynamically control a capacitance of load capacitors C3, C4 to perform frequency correction for temperature variations in crystal 183. Note that in such embodiments, there is no need for a frequency synthesizer.

Furthermore, while not shown for ease of illustration, understand that a reference clock signal generated by crystal oscillator 180 may be used for controlling various logic and circuitry of integrated circuit 110. This clock signal or another clock signal generated by way of a frequency divider (not shown for ease of illustration in FIG. 1B) may be used to control equivalent resistance of switched capacitor C2. Understand also that integrated circuit 110 itself may take various forms, and may include logic circuitry, ADC circuitry, potentially radio circuitry and so forth.

Figure 2:
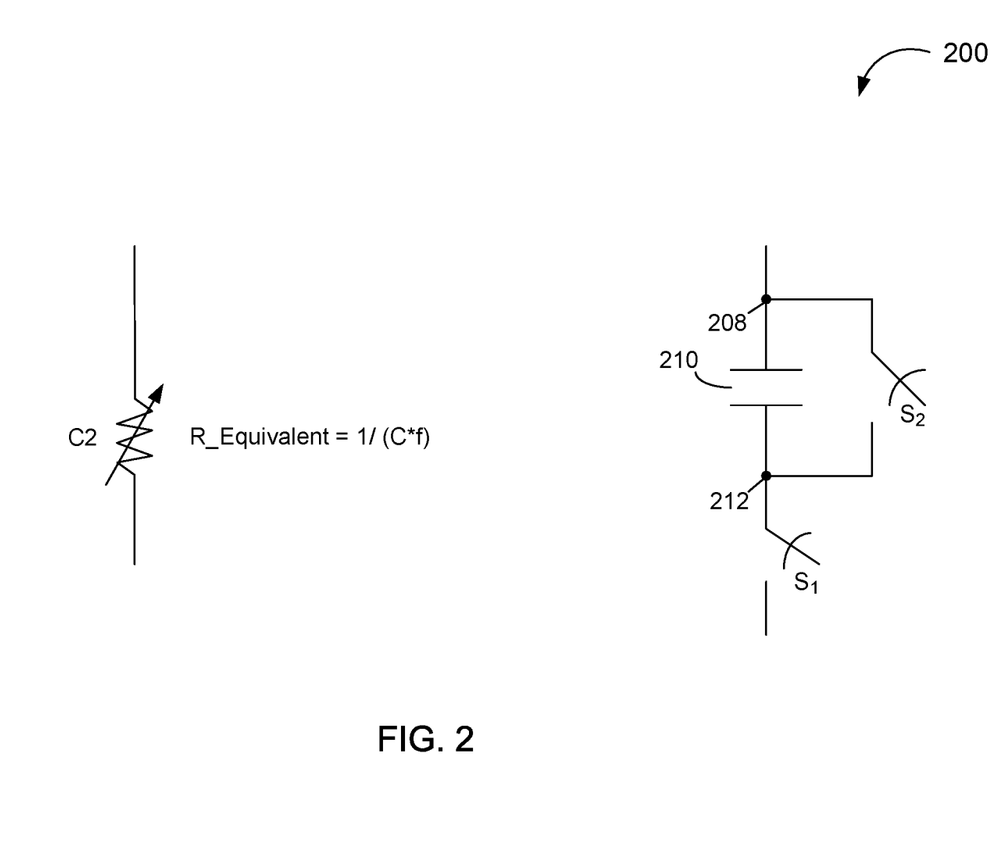
FIG. 2 is a schematic diagram of a switched capacitor in accordance with an embodiment.

Referring now to FIG. 2, shown is a schematic diagram of a switched capacitor in accordance with an embodiment. As illustrated in FIG. 2, switched capacitor 200 is implemented with a fixed capacitance 210 (coupled between a first node 208 and a second node 212) and switches S1 and S2. More specifically, switch S2 couples in parallel with the plates of capacitor 210, while in turn switch S1 couples to second node 212. In embodiments, when switch S2 is closed (and switch S1 is open) capacitor 210 discharged. In turn, when switch S2 is opened and switch S1 is closed, capacitor 210 charges capacitor C1 (of FIG. 1A) via second node 212. Note that capacitor C1 may be used to reduce switching ripple. Capacitor 210 may be implemented as a MOM capacitor formed on multiple layers of a semiconductor die. In embodiments herein, with this MOM capacitor configuration, there is very little difference in capacitance over operating temperatures. And as such, a single, e.g., factory calibration of capacitance may be performed, with a calibrated equivalent resistance stored in a non-volatile storage of the integrated circuit. Note that while this capacitance value does not change over temperature, the equivalent resistance of switched capacitor 200 may be dynamically controlled during operation by changing the switching frequency. In embodiments, the equivalent resistance of switched capacitor 200 may be equal to 1/(C×f), where C is the capacitance value of capacitor 210 and f is the switching frequency.

An integrated circuit including a measurement circuit as described herein may further include an on-chip temperature sensor. Note that this temperature sensor may not be suitable for determining temperature of the external crystal oscillator. This is so for several reasons. First, such on-chip temperature sensor (which in an embodiment may be implemented as a band gap reference circuit) may not have sufficient accuracy to measure the external crystal oscillator temperature to a desired level of accuracy (e.g., less than approximately +/−1° C.). Second, there may be a temperature difference between the chip and the off-chip thermistor greater than a desired accuracy.

Figure 3:
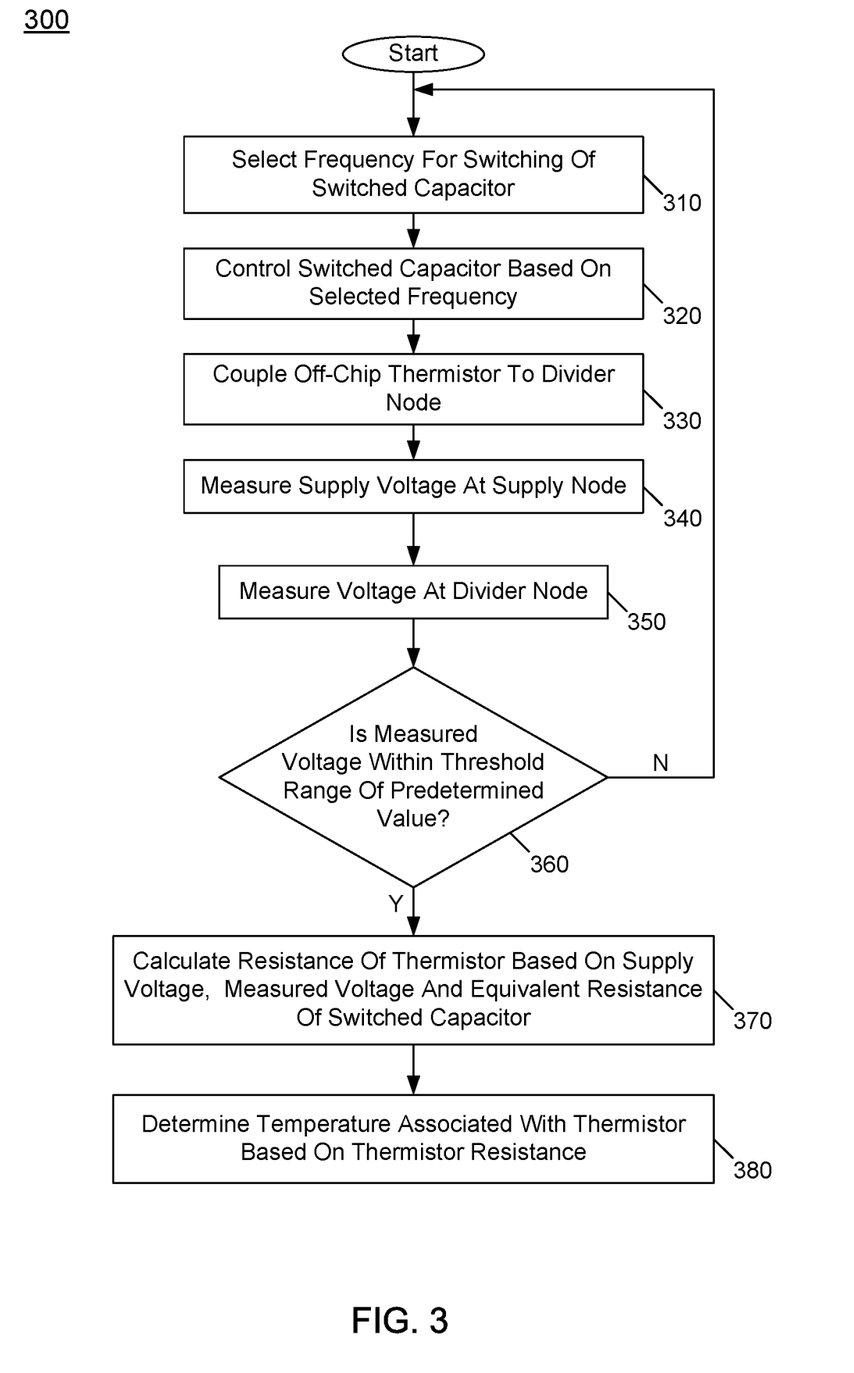
FIG. 3 is a flow diagram of a method in accordance with an embodiment.

Referring now to FIG. 3, shown is a flow diagram of a method in accordance with an embodiment. More specifically, method 300 of FIG. 3 is a method for sensing temperature at a location external to an integrated circuit, using sensing circuitry of the integrated circuit. As such, method 300 may be performed by hardware circuitry, software, firmware and/or combinations thereof. For example a microcontroller may be configured to execute instructions stored in a non-transitory storage medium to perform method 300. For purposes of discussion in FIG. 3, assume that the external location is associated with an off-chip thermistor, which may be included in a package with a crystal (or a complete crystal oscillator). Or in other cases, the external thermistor may be a standalone component (possibly thermally coupled to a crystal oscillator) or simply a thermistor positioned at a location, e.g., on a circuit board, within a system or at another location at which temperature is to be sensed.

As illustrated, method 300 begins by selecting a frequency for switching of the switched capacitor, such that a given equivalent resistance may be generated (block 310). In some cases, a predetermined value, such as an ambient temperature condition value, e.g., stored in a non-volatile storage may be selected. In other cases as described further below, this frequency selection may be based on a previous setting, a temperature of the integrated circuit or so forth. In any event, control next passes to block 320 where the switched capacitor is controlled based on the selected frequency. That is, the switched capacitor may be alternately charged and discharged according to a clock signal having this selected switching frequency. Still further, at block 330 the off-chip thermistor may be coupled to a divider node. Namely this divider node is a node that couples the switched capacitor to the thermistor. This coupling may occur dynamically, e.g., by way of a switch, such that the thermistor is coupled to the divider node for purposes of temperature sensing of method 300. Thereafter the thermistor may be de-coupled from the divider node.

Still with reference to FIG. 3, next at block 340 a supply voltage at a supply voltage node (coupled to a charging node of the switched capacitor) may be measured. In some cases, a given fixed supply voltage value may be used. In other cases, the supply voltage node may be coupled to an ADC to enable its measurement, as this supply voltage also may dynamically vary over temperature or other operating condition. Next, at block 350 the voltage at the divider node may be measured. This voltage may be based at least in part on a ratio of the resistances of the switched capacitor and the thermistor.

Next it may be determined whether the measured voltage is within a threshold range of a predetermined value (diamond 360). In this regard, note that more accurate thermal measurements may be made when the equivalent resistance of the switched capacitor is relatively close in value to the resistance of the thermistor. In an embodiment, this determination may identify whether the measured voltage is approximately half of the full scale voltage (namely the supply voltage). Of course, exact matching of resistances is not necessary to obtain the desired thermal accuracy. In one particular embodiment, the determination at diamond 360 may be based on whether the measured voltage is within a threshold range of approximately 40% of a given threshold (which may be a mid-point value of the supply voltage). Of course in other embodiments, different threshold ranges may be used. Note that if the measured voltage is not within this threshold range of the given value, control passes back to block 310 where another switching frequency may be selected (to thus change the equivalent resistance of the switched capacitor).

Still with reference to FIG. 3, instead if it is determined that the measured voltage is within this threshold range, control passes to block 370. There a calculation of the thermistor resistance may be made. More specifically, this thermistor resistance may be calculated based on the measured supply voltage, the measured voltage and the equivalent resistance of the switched capacitor. In one particular embodiment, the thermistor resistance is calculated using a ratio of the supply voltage and the voltage on the thermistor as follows:

$$Rtherm = \frac{Vsense}{\left(\frac{Vsupply - Vsense}{Req}\right)} \text{ or } \frac{Vsense}{Vsupply - Vsense} \cdot Req,$$

where Rtherm is the thermistor resistance, Vsense is the measured voltage at the divider node, Vsupply is the measured supply voltage, and Req is the equivalent resistance of the switched capacitor. Since a ratio is used, and not an absolute measurement accuracy of the ADC, any gain error due to temperature variation of the ADC will cancel out.

Next, control passes to block 380 where a temperature associated with the thermistor (namely the temperature at the location of the thermistor) may be determined. More specifically, this determination may be based on the thermistor resistance. In embodiments, a lookup table may be stored in non-volatile memory that includes multiple entries each having an association between thermistor resistance (or resistance range) and corresponding temperature (or temperature range). Thus based upon access to a given entry by way of the determined thermistor resistance, a temperature can be determined. Alternately, temperature may be calculated via the controller based on a polynomial function that maps thermistor resistance to temperature.

Different use cases for this temperature may be possible. For example, in some cases such as where the measurement circuit is part of a thermostat, thermometer or so forth, the temperature may be provided, e.g., to a display or to a control circuit that controls an air conditioning, heating or other HVAC system based upon this value, or so forth. In embodiments as described above, this temperature may be used to perform temperature compensation for an off-chip oscillator associated with the thermistor. Of course other embodiments are possible. Although shown at this high level in the embodiment of FIG. 3, variations and alternatives are possible.

Figure 4:
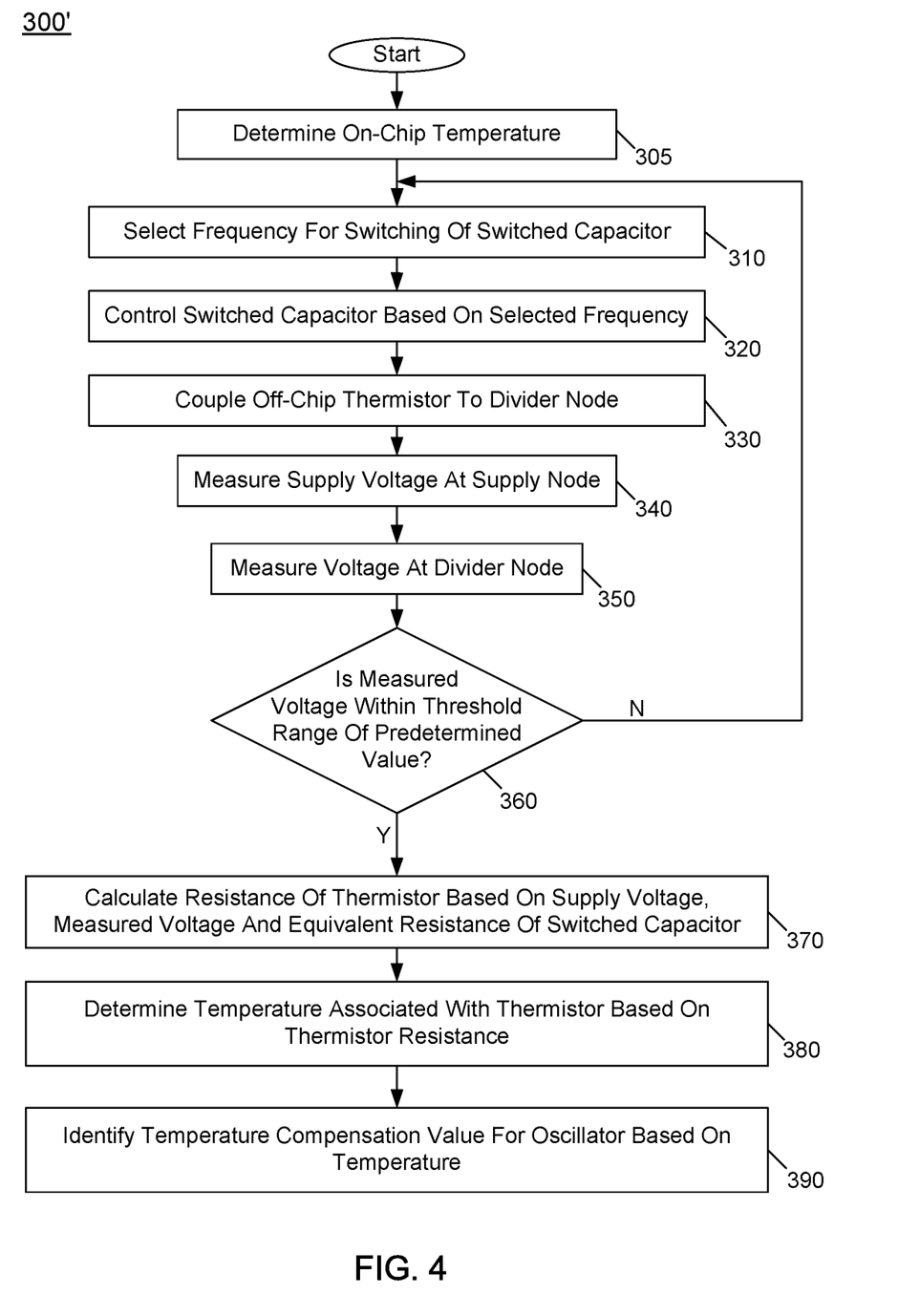
FIG. 4 is a flow diagram of another method in accordance with an embodiment.

For example, additional optional techniques may be used to begin a measurement process with a more accurate (i.e., more closely matched) equivalent resistance for the switched capacitor. Furthermore, as described above it is possible to use the resulting determined temperature for purposes of temperature compensation. Referring now to FIG. 4, shown is a flow diagram of another method in accordance with an embodiment. More specifically, FIG. 4 shows a method 300', which in large respects is the same as method 300 of FIG. 3. However as shown in FIG. 4, the frequency selection performed at block 310 occurs based on a determination of on-chip temperature which may be performed at block 305. In an embodiment, an integrated circuit may include one or more on-die temperature sensors, such as implemented as a bandgap reference circuit. Based upon a temperature of the integrated circuit (or at least a portion of a semiconductor die close to or including the switched capacitor), an initial switching frequency for the switched capacitor can be selected that may avoid the need for multiple loops to determine a correct equivalent resistance. That is, this coarse die temperature measurement may be used to set the switched capacitor frequency setting and avoid multiple measurements to find the correct R_Equivalent value of the switched comparator for maximum accuracy. In embodiments, the die temperature may be within 20° C. of the thermistor temperature, which may allow selection of an appropriate R_Equivalent value. In an embodiment, a non-volatile memory may store a lookup table having multiple entries, each associating a temperature range and a corresponding equivalent resistance setting, which may be used to control switching frequency for the switched capacitor.

Otherwise method 300' proceeds similarly to method 300 until block 390. At block 390, the determined temperature may be used to identify a temperature compensation value for the off-chip crystal oscillator. To this end, based upon this determined temperature, access may be made to a polynomial calculation or another lookup table (stored in a non-volatile memory) that includes multiple entries, each associating a temperature (or temperature range) with a corresponding temperature compensation value. In turn, this temperature compensation value may be provided to a frequency synthesizer, to compensate for variations in the incoming clock signal received from the crystal oscillator. In other cases, such as where a load capacitance for the crystal oscillator is included on-chip, the temperature compensation may be by way of control signals that dynamically tune the load capacitance to compensate for temperature variation in the off-chip crystal. In other aspects, method 300' may proceed the same as discussed above with regard to FIG. 3. With this thermal compensation for frequencies generated by an internal synthesizer, frequency drift of the external crystal oscillator over temperature may be sufficiently compensated to maintain required frequency stability for a given wireless communication protocol.

Figure 5:
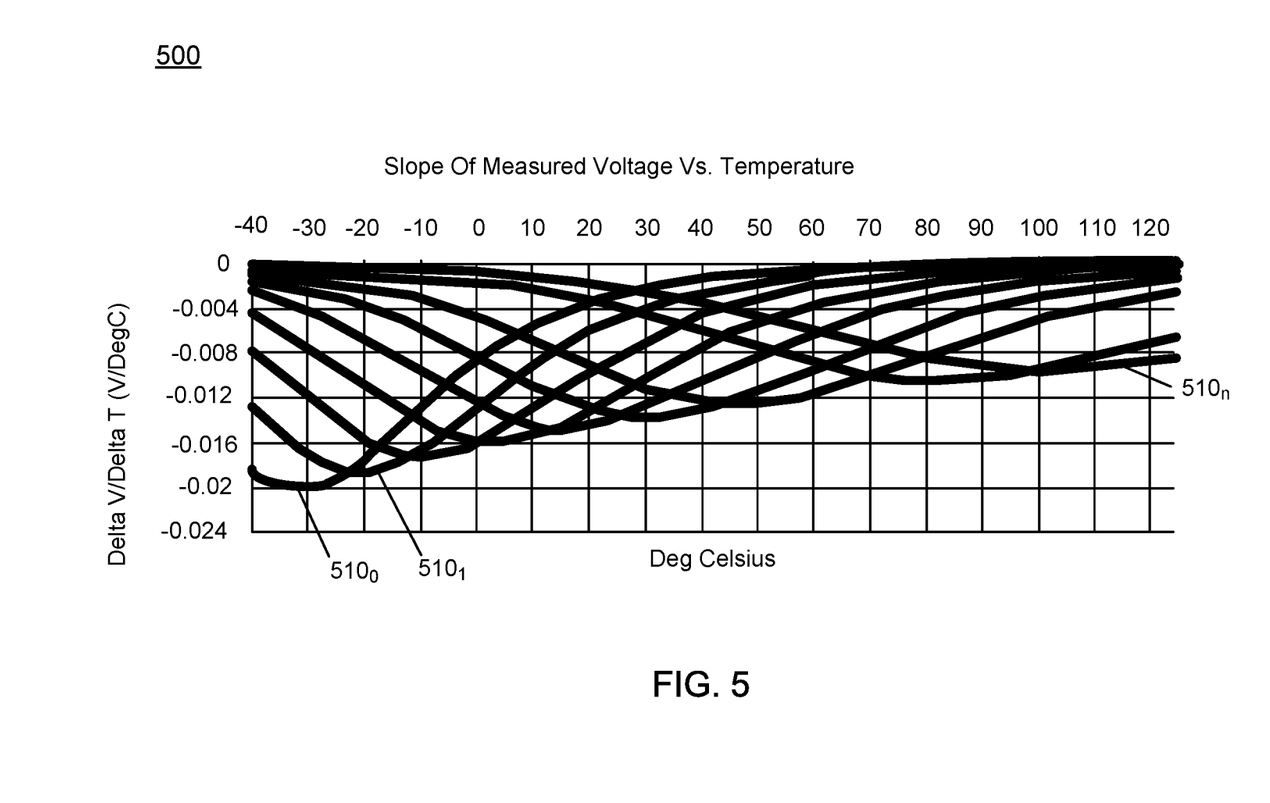
FIG. 5 is a series of curves, each associating slope of measured voltage over temperature for different switching frequency settings of a switched capacitor.

Note that with the above-described techniques, accurate measurement may be realized by dynamically controlling the equivalent resistance of the switched capacitor. In this way, as the thermistor resistance varies, the corresponding switched capacitor equivalent resistance may be varied to maintain measurement accuracy. This is so, because large differences between these two resistances degrade measurement accuracy. Referring now to FIG. 5, shown is a series of curves, each associating slope of measured voltage over temperature for different switching frequency settings of a switched capacitor. These curves each associate a change in sensed voltage per degree Celsius change, versus the actual temperature of the thermistor. When this Delta sensed voltage per Delta degree Celsius is small in magnitude, the measurement accuracy diminishes. All the Delta sensed voltage per Delta degree Celsius are negative because the thermistor of this embodiment has a negative temperature coefficient. More specifically, each curve 510$_0$-510$_n$ is associated with a different equivalent switched capacitor resistance. In general, as temperature increases from the lowest values (on the left side of illustration 500) to higher values (on the right side of illustration 500), equivalent resistance is decreased. As representative examples, curve 510$_0$ is associated with an equivalent resistance of 1.9 MOhm, and curve 510$_2$ is associated with an equivalent resistance of approximately 475 kOhm. Proceeding to curve 510$_n$, it is associated with an equivalent resistance of approximately 3.7 kOhm. Note that accuracy may best occur by selecting an equivalent resistance that provides a more negative (higher magnitude) of Delta sensed voltage per Delta degree Celsius. This pull up resistor value adjustment changes to a curve that has a more negative slope for the same temperature and thermistor resistance. As such, as temperature increases, equivalent resistances may be selected in decreasing fashion. To this end, the switching frequency of the switched capacitor increases as temperature increases.

Note that a calibration process to calibrate the equivalent resistance of the switched capacitor may proceed during manufacturing testing as discussed above. In such process, the integrated circuit may couple, e.g., via a general purpose input/output (GPIO) pin to a known precision resistor. In turn, the switching frequency for the switched capacitor may be selected so that its equivalent resistance is similar to the resistance of this known precision resistor. Thereafter, the voltage at the divider node may be measured. With this value, the supply voltage and the known external resistance, the equivalent resistance may be determined according to: Req=(Vsupply−Vmeasured)/(Vmeasured/Rext), where Vsupply is the measured supply voltage, Vmeasured is the voltage at the divider node, and Rext is the known external resistance. This determined equivalent resistance may be stored in a non-volatile memory as a baseline equivalent resistance for the given switching frequency.

Figure 6:
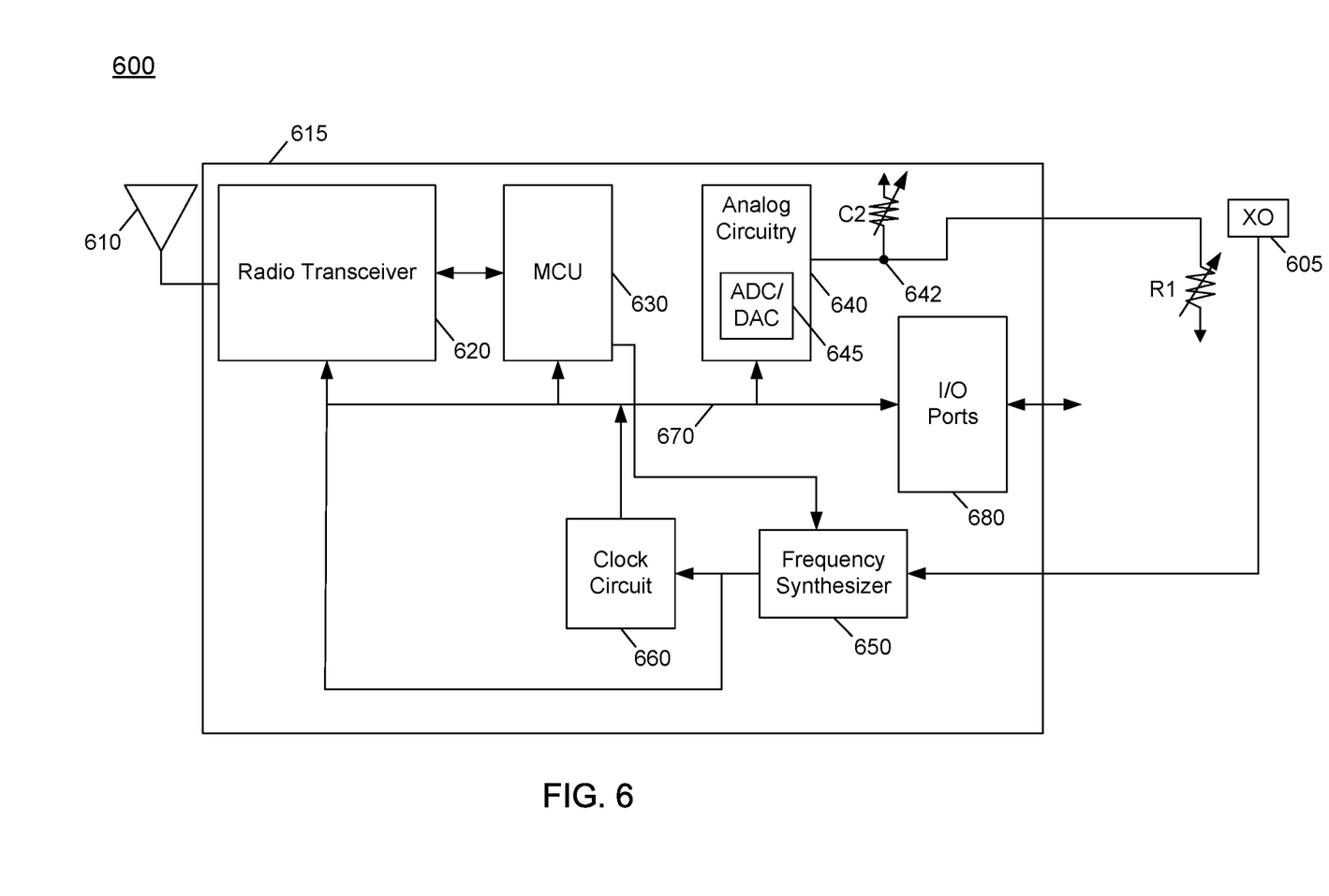
FIG. 6 is a block diagram of a system in accordance with an embodiment.

Referring now to FIG. 6, shown is a block diagram of a system in accordance with an embodiment. As shown in FIG. 6, system 600 includes an integrated circuit 615 that may take the form of a wireless transceiver or other such circuit. As seen, integrated circuit 615 is coupled to an antenna 610, which may provide for transmission and receipt of radio frequency (RF) signals of one or more bands (or in some cases multiple such antennas may be present).

In turn, antenna 610 couples to a radio transceiver 620 which may include one or more signal processing paths to process incoming and outgoing RF signals of the one or more bands. In turn, radio transceiver 620 communicates with an MCU 630, which may include the main processing and control circuitry of the integrated circuit. MCU 630 communicates with additional circuitry, including analog circuitry 640, which may act as an interface to various analog components such as a variety of different off-chip sensors that may couple to integrated circuit 615 via a set of I/O ports 680. In the embodiment shown, analog circuitry 640 includes an analog-to-digital/digital-to-analog circuitry (ADC/DAC) 645 to digitize incoming analog signals received from such off-chip sources and to convert to analog form digital information, such as control information to be communicated to off-chip sources. A set of interconnects 670 may couple the various components of the integrated circuit, to provide communication of power, clock and data signals.

To perform the temperature measurements described herein, a measurement circuit may be implemented that incorporates an on-chip switched capacitor C2 coupled between a supply voltage node and a divider node 642. As further illustrated, an off-chip resistance R1, namely an off-chip thermistor further couples to this divider node. In turn, the voltage at divider node 642 may be provided to ADC 645 for digitization. In turn, this resulting value may be provided MCU 630, which may determine based at least in part on this information, the supply voltage level and the equivalent resistance of switched capacitor C2, a temperature of thermistor R1. To this end, MCU 630 may include or be coupled to a non-transitory storage medium that stores instructions that when executed enable MCU 630 to perform the temperature measurement described herein.

Still further these instructions may enable compensation to be performed within a frequency synthesizer 650. As illustrated, frequency synthesizer 650 receives a reference clock signal from an off-chip crystal oscillator 605. Based on the temperature of thermally coupled thermistor R1, MCU 630 may determine one or more appropriate temperature compensation values to be provided to frequency synthesizer 650 to perform compensation for frequency drift, such that one or more clock signals generated in frequency synthesizer 650 and/or clock circuit 660 may be at appropriate frequencies. Understand while shown at this high level in the illustration of FIG. 6, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
    a switched capacitor coupled between a supply voltage node and a divider node, wherein a thermistor external to the integrated circuit is to couple to the divider node;
    an analog-to-digital converter (ADC) having an input coupled to the divider node to receive a voltage at the divider node and generate a digital value based thereon; and
    a controller coupled to receive the digital value from the ADC, wherein the controller is to determine a temperature associated with the thermistor based at least in part on the digital value.

2. The integrated circuit of claim 1, wherein the controller is to calculate a resistance of the thermistor based at least in part on the digital value and a value of a supply voltage provided to the supply voltage node.

3. The integrated circuit of claim 2, wherein the controller is to calculate the resistance of the thermistor further based on an equivalent resistance of the switched capacitor.

4. The integrated circuit of claim 3, wherein the equivalent resistance of the switched capacitor is based on a capacitance of the switched capacitor and a frequency of switching of the switched capacitor.

5. The integrated circuit of claim 4, further comprising a frequency synthesizer to generate a first clock signal.

6. The integrated circuit of claim 5, wherein the frequency synthesizer is to receive an input clock signal from an oscillator coupled to the integrated circuit and generate the first clock signal using the input clock signal.

7. The integrated circuit of claim 6, wherein the controller is to compensate for a temperature variation of the oscillator based on the temperature associated with the thermistor, the thermistor thermally coupled to the oscillator.

8. The integrated circuit of claim 4, further comprising a frequency divider to generate the switching frequency based on a first clock signal received from an oscillator.

9. The integrated circuit of claim 8, further comprising a temperature sensor to measure a temperature of the integrated circuit.

10. The integrated circuit of claim 9, wherein the controller is to control the frequency divider to generate the switching frequency based at least in part on the temperature of the integrated circuit.

11. The integrated circuit of claim 3, wherein the controller is to cause the equivalent resistance of the switched capacitor to be updated if the voltage at the divider node is outside of a predetermined range.

12. The integrated circuit of claim 3, wherein the controller is to cause the equivalent resistance of the switched capacitor to at least substantially track the resistance of the thermistor.

13. The integrated circuit of claim 1, wherein the controller, based at least in part on the temperature, is to control a capacitance of an oscillator to compensate for a temperature variation of the oscillator.

14. The integrated circuit of claim 1, further comprising a selection circuit to selectively couple a plurality of thermistors external to the integrated circuit to the divider node.

15. At least one non-transitory computer readable medium including instructions that when executed enable a system to perform a method comprising:
    controlling, by a controller of a semiconductor die, a first switch and a second switch to operate at a first switching frequency to cause a switched capacitor adapted on the semiconductor die to be switchably coupled between a first node and a second node;

coupling a thermistor to the second node, the thermistor external to the semiconductor die;
measuring a voltage at the second node when the thermistor is coupled to the second node;
calculating, by the controller, a resistance of the thermistor based on a voltage of the first node, the voltage at the second node, and a resistance of the switched capacitor; and
determining, by the controller, a temperature of the thermistor using the resistance of the thermistor.

16. The at least one non-transitory computer readable medium of claim 15, wherein the method further comprises determining a temperature of the semiconductor die and based at least in part thereon, changing the first switching frequency to a second switching frequency.

17. The at least one non-transitory computer readable medium of claim 15, wherein the method further comprises compensating for a frequency shift of an oscillator coupled to the semiconductor die based on the temperature of the thermistor, the oscillator thermally coupled with the thermistor.

18. A system comprising:
an antenna to receive and provide a radio frequency (RF) signal to an integrated circuit including a wireless transceiver;
a crystal oscillator to provide a reference clock signal to the integrated circuit;
a thermistor thermally coupled with the crystal oscillator; and
the integrated circuit comprising:
a frequency synthesizer to receive the reference clock signal and generate one or more clock signals using the reference clock signal;
a switched capacitor coupled between a supply voltage node and a divider node, the thermistor to couple to the divider node; and
a controller coupled to the divider node, wherein the controller is to determine a temperature associated with the thermistor based at least in part on a voltage at the divider node and compensate for frequency drift of the reference clock signal based at least in part on the temperature associated with the thermistor.

19. The system of claim 18, wherein the controller is to calculate a resistance of the thermistor based on the voltage at the divider node, a value of a supply voltage provided to the supply voltage node, and an equivalent resistance of the switched capacitor, the equivalent resistance of the switched capacitor based on a capacitance of the switched capacitor and a frequency of switching of the switched capacitor, wherein the controller is to control the frequency of switching based at least in part on a temperature of the integrated circuit.

20. The system of claim 18, wherein the controller is to dynamically control a load capacitance of the crystal oscillator to compensate for the frequency drift.

* * * * *